(12) United States Patent
Hayashi et al.

(10) Patent No.: US 11,368,138 B2
(45) Date of Patent: Jun. 21, 2022

(54) ELASTIC WAVE DEVICE

(71) Applicant: Murata Manufacturing Co., Ltd., Nagaokakyo (JP)

(72) Inventors: Yasunobu Hayashi, Nagaokakyo (JP); Takashi Yamane, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 663 days.

(21) Appl. No.: 16/274,279

(22) Filed: Feb. 13, 2019

(65) Prior Publication Data
US 2019/0288667 A1 Sep. 19, 2019

(30) Foreign Application Priority Data

Mar. 19, 2018 (JP) .............................. JP2018-050601

(51) Int. Cl.
| | | |
|---|---|---|
| *H03H 9/05* | (2006.01) | |
| *H03H 9/145* | (2006.01) | |
| *H01L 41/047* | (2006.01) | |
| *H03H 9/25* | (2006.01) | |
| *H03H 9/02* | (2006.01) | |

(Continued)

(52) U.S. Cl.
CPC ......... *H03H 9/058* (2013.01); *H01L 41/0475* (2013.01); *H01L 41/1873* (2013.01); *H03H 9/02992* (2013.01); *H03H 9/14541* (2013.01); *H03H 9/25* (2013.01); *H03H 3/08* (2013.01)

(58) Field of Classification Search
CPC .. H03H 9/58; H03H 9/02992; H03H 9/14541; H03H 9/25; H03H 3/08; H01L 41/1873; H01L 41/0475
See application file for complete search history.

(56) References Cited

U.S. PATENT DOCUMENTS

| | | | |
|---|---|---|---|
| 9,548,437 B2* | 1/2017 | Ohashi | H03H 9/1092 |
| 10,243,536 B2* | 3/2019 | Saijo | H03H 9/132 |
| 10,320,362 B2* | 6/2019 | Kikuchi | H01L 41/0475 |

(Continued)

FOREIGN PATENT DOCUMENTS

| | | |
|---|---|---|
| JP | 2013-031030 A | 2/2013 |
| JP | 2013-048489 A | 3/2013 |

(Continued)

OTHER PUBLICATIONS

Official Communication issued in corresponding Japanese Patent Application No. 2018-050601, dated Dec. 1, 2020.

*Primary Examiner* — J. San Martin
(74) *Attorney, Agent, or Firm* — Keating & Bennett, LLP

(57) ABSTRACT

An elastic wave device includes a spacer layer on or above a support substrate and outside a piezoelectric film as seen in a plan view from a thickness direction of the support substrate. A cover layer is disposed on the spacer layer. A through electrode extends through the spacer layer and the cover layer and is electrically connected to the wiring electrode. The wiring electrode includes a first section overlapping the through electrode as seen in the plan view from the thickness direction, a second section overlapping the piezoelectric film as seen in the plan view from the thickness direction, and a step portion defining a step in the thickness direction between the first section and the second section. The spacer layer includes an end portion embedded in the cover layer.

17 Claims, 7 Drawing Sheets

(51) Int. Cl.
*H01L 41/187* (2006.01)
*H03H 3/08* (2006.01)

(56) References Cited

U.S. PATENT DOCUMENTS

| | | | |
|---|---|---|---|
| 10,707,830 B2 * | 7/2020 | Kikuchi | H03H 3/08 |
| 2010/0225202 A1 | 9/2010 | Fukano et al. | |
| 2010/0327694 A1 * | 12/2010 | Omote | H03H 9/1092 |
| | | | 310/313 R |
| 2013/0027156 A1 | 1/2013 | Yamato | |
| 2014/0339956 A1 | 11/2014 | Kanae | |
| 2016/0277003 A1 | 9/2016 | Kikuchi et al. | |
| 2016/0294354 A1 | 10/2016 | Saijo et al. | |
| 2016/0380611 A1 * | 12/2016 | Kai | H03H 9/02992 |
| | | | 310/313 B |
| 2017/0359049 A1 | 12/2017 | Toyota | |
| 2018/0091116 A1 * | 3/2018 | Kai | H03H 9/1064 |
| 2018/0097502 A1 | 4/2018 | Yamamoto et al. | |
| 2018/0102757 A1 | 4/2018 | Fukushima et al. | |
| 2018/0241370 A1 | 8/2018 | Sekiya et al. | |
| 2018/0358950 A1 * | 12/2018 | Yamamoto | H03H 9/1071 |
| 2019/0165758 A1 * | 5/2019 | Sakai | H03H 9/02834 |
| 2019/0181828 A1 * | 6/2019 | Iwamoto | H03H 9/02897 |
| 2019/0190484 A1 * | 6/2019 | Fukuda | H03H 3/08 |

FOREIGN PATENT DOCUMENTS

| | | |
|---|---|---|
| JP | 2017-011681 A | 1/2017 |
| KR | 10-2014-0112511 A | 9/2014 |
| WO | 2015/098678 A1 | 7/2015 |
| WO | 2015/098679 A1 | 7/2015 |
| WO | 2016/147724 A1 | 9/2016 |
| WO | 2016/208426 A1 | 12/2016 |
| WO | 2016/208428 A1 | 12/2016 |
| WO | 2017/098809 A1 | 6/2017 |

* cited by examiner

ELASTIC WAVE DEVICE

CROSS REFERENCE TO RELATED APPLICATIONS

This application claims the benefit of priority to Japanese Patent Application No. 2018-050601 filed on Mar. 19, 2018. The entire contents of this application are hereby incorporated herein by reference.

BACKGROUND OF THE INVENTION

1. Field of the Invention

The present invention relates generally to elastic wave devices, and more specifically, to an elastic wave device including a support substrate and a piezoelectric film.

2. Description of the Related Art

There is a known elastic wave device in which a multilayer film that includes a piezoelectric thin film (piezoelectric film) is disposed on a support substrate (see, for example, International Publication No. 2015-098678).

The elastic wave device described in International Publication No. 2015-098678 includes the support substrate, the piezoelectric thin film, an interdigital transducer (IDT) electrode (functional electrode), an insulating layer, a wiring electrode, an electrode pad, a support member (spacer layer), a lid element (cover layer), an under-bump metal layer (through electrode), and a metallic bump (external connection terminal).

In the above-described elastic wave device, the insulating layer is disposed outside a region in which the multilayer film is disposed on the support substrate. The wiring electrode extends from the piezoelectric film along a side surface of the multilayer film to the insulating layer. In the portion of the wiring electrode on the insulating layer, the electrode pad is integral with the wiring electrode.

An electronic component module in which the above-described elastic wave device is mounted on a circuit board having a different coefficient of linear expansion from that of the support substrate has a problem in that a break may occur in the wiring electrode at a section disposed along the side surface of the multilayer film (step portion) in the above-described elastic wave device or another area in a thermal shock test.

SUMMARY OF THE INVENTION

Preferred embodiments of the present invention provide elastic wave devices that are each capable of improving reliability of a wiring electrode and ability to withstand a thermal shock test.

An elastic wave device according to a preferred embodiment of the present invention includes a support substrate, a piezoelectric film, a functional electrode, a wiring electrode, a spacer layer, a cover layer, and a through electrode. The piezoelectric film is disposed on or above the support substrate. The functional electrode is disposed on or above the piezoelectric film. The wiring electrode is electrically connected to the functional electrode. The spacer layer is disposed on or above the support substrate, and disposed outside the piezoelectric film as seen in a plan view from a thickness direction of the support substrate. The cover layer is disposed on the spacer layer. The through electrode extends through the spacer layer and the cover layer and is electrically connected to the wiring electrode. The wiring electrode includes a first section overlapping the through electrode as seen in the plan view from the thickness direction, a second section overlapping the piezoelectric film as seen in the plan view from the thickness direction, and a step portion defining a step in the thickness direction between the first section and the second section. The spacer layer includes an end portion embedded in the cover layer.

Elastic wave devices according to preferred embodiments of the present invention are each capable of improving the reliability of the wiring electrode and ability to withstand a thermal shock test.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
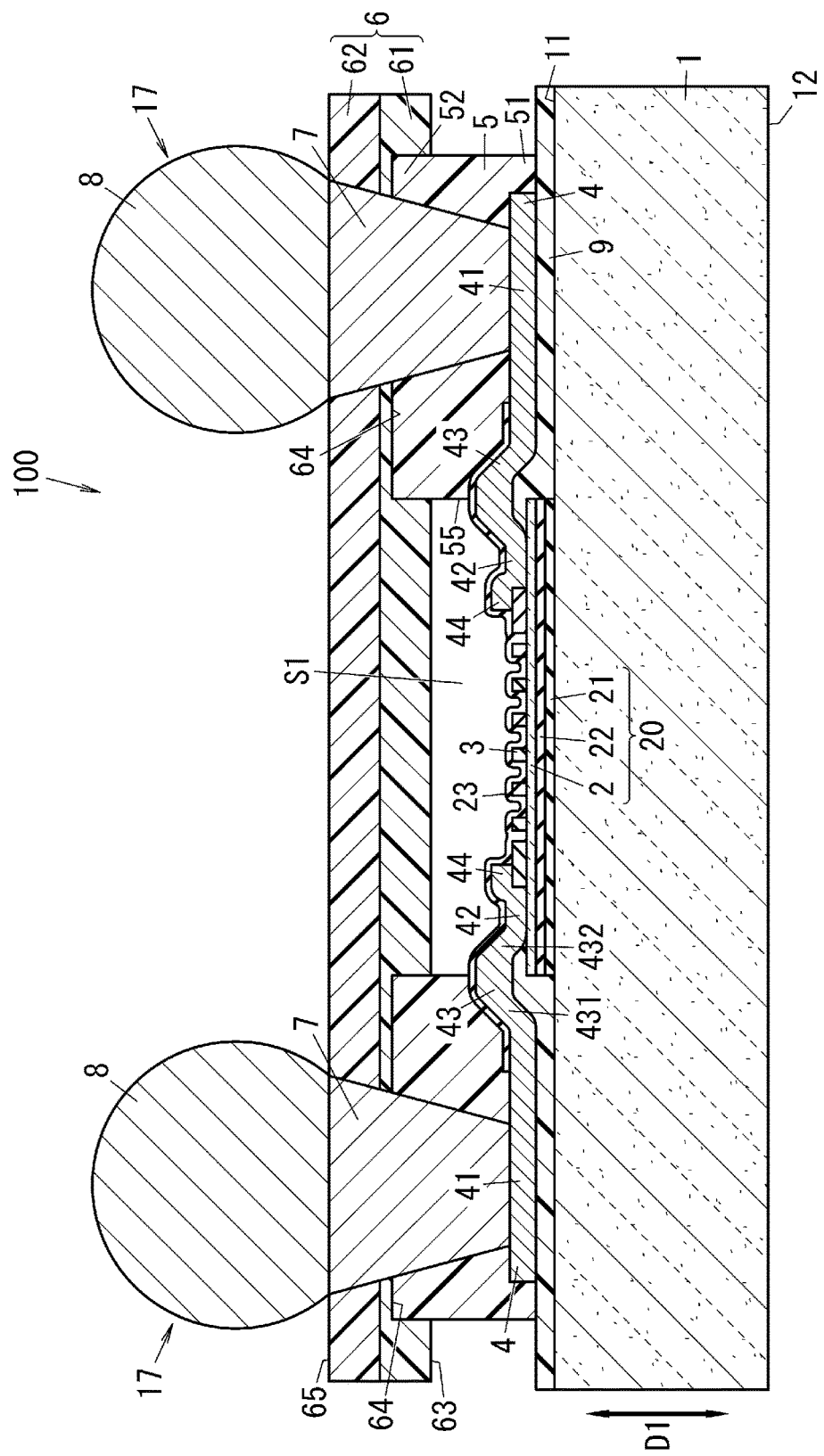
FIG. 1 is a cross-sectional view of an elastic wave device according to a first preferred embodiment of the present invention.

Elastic wave devices according to first to fifth preferred embodiments are described below with reference to the accompanying drawings.

FIGS. 1, 2, and 4 to 7 referred to in the first to fifth preferred embodiments below are schematic diagrams, and the ratios of sizes and the ratios of thicknesses of elements in the drawings may not indicate actual dimensional ratios.

First Preferred Embodiment

An elastic wave device 100 according to a first preferred embodiment of the present invention is described below with reference to the drawings.

The elastic wave device 100 according to the first preferred embodiment includes a support substrate 1, a piezoelectric film 2, an interdigital transducer (IDT) electrode 3, wiring electrodes 4, a spacer layer 5, a cover layer 6, and through electrodes 7. The piezoelectric film 2 is disposed above the support substrate 1. The term "disposed above" used herein indicates "in indirect contact with." The IDT electrode 3 is a functional electrode disposed on the piezoelectric film 2. The wiring electrodes 4 are electrically connected to the IDT electrode 3. The spacer layer 5 is disposed above the support substrate 1. The spacer layer 5 is disposed outside the IDT electrode 3 as seen in a plan view from a thickness direction D1 of the support substrate 1. The cover layer 6 is disposed on the spacer layer 5. The through electrodes 7 extend through the spacer layer 5 and the cover layer 6 and are electrically connected to the wiring electrodes 4, respectively. Each of the wiring electrodes 4 includes a first section 41 overlapping the corresponding through electrode 7 as seen in the plan view from the thickness direction D1 and a second section 42 overlapping the piezoelectric film 2 as seen in the plan view from the thickness direction D1.

The elastic wave device 100 further includes external connection terminals 8. The external connection terminals 8 are electrically connected to the through electrodes 7, respectively. The elastic wave device 100 further includes an insulating layer 9 disposed on the support substrate 1. In the elastic wave device 100, a portion of the wiring electrode 4 is disposed on the insulating layer 9. In the elastic wave device 100, the spacer layer 5 is disposed on the wiring electrode 4 and on the insulating layer 9. In the elastic wave device 100, each of the through electrodes 7 is disposed on the corresponding wiring electrode 4.

Next, the elements of the elastic wave device 100 are described with reference to the drawings.

As illustrated in FIG. 1, the support substrate 1 supports a multilayer body including the piezoelectric film 2 and the IDT electrode 3. The support substrate 1 includes a front surface 11 and a back surface 12 on opposite sides in the thickness direction D1. The plan-view shape of the support substrate 1 (outer edge shape when the support substrate 1 is seen in the plan view from the thickness direction D1) may preferably be, but is not limited to, for example, a rectangular or substantially rectangular shape. Another example of the shape may be a square or substantially square shape. One example of the support substrate 1 may preferably be a silicon substrate. One example thickness of the support substrate 1 may preferably be about 120 µm. The support substrate 1 is not restricted to the silicon substrate. Examples of the support substrate 1 may include, for example a germanium substrate, a diamond substrate, a diamond-like carbon substrate, a lithium tantalate substrate, and a lithium niobate substrate. Accordingly, the material of the support substrate 1 is not restricted to silicon, and it may be germanium, diamond, or diamond-like carbon, for example.

The IDT electrode 3 may preferably be made of an appropriate metal material, such as aluminum, copper, platinum, gold, silver, titanium, nickel, chromium, molybdenum, tungsten, or an alloy including any of these metals, for example. The IDT electrode 3 may have a structure in which a plurality of metal films made of any of the above-described metals and alloys are laminated.

Figure 2:
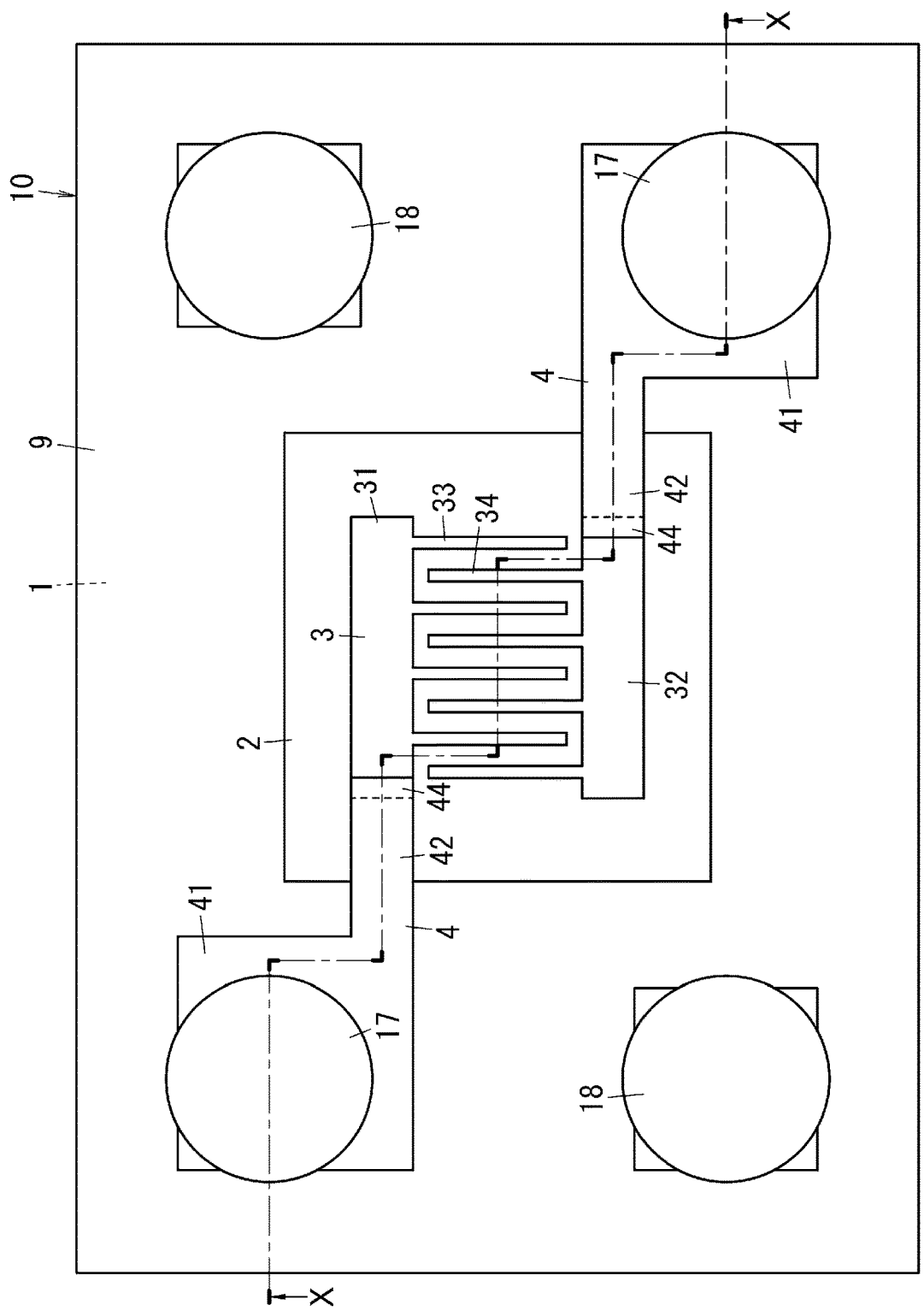
FIG. 2 is a plan view of the elastic wave device according to the first preferred embodiment of the present invention without a protective film and a cover layer.

As illustrated in FIG. 2, the IDT electrode 3 includes a pair of busbars 31 and 32 (hereinafter also referred to as first busbar 31 and second busbar 32), a plurality of electrode fingers (hereinafter also referred to as first electrode fingers 33), and a plurality of electrode fingers 34 (hereinafter also referred to as second electrode fingers 34).

The first busbar 31 and second busbar 32 have an elongated shape whose longitudinal direction is (second direction) perpendicular or substantially perpendicular to the thickness direction D1 (first direction) of the support substrate 1. In the IDT electrode 3, the first busbar 31 and the second busbar 32 face each other in a third direction perpendicular or substantially perpendicular to both of the thickness direction D1 (first direction) of the support substrate 1 and the second direction.

The plurality of first electrode fingers 33 are connected to the first busbar 31 and extend toward the second busbar 32. The plurality of first electrode fingers 33 extend from the first busbar 31 along the direction (third direction) perpendicular or substantially perpendicular to the longitudinal direction (second direction) of the first busbar 31. The ends of the plurality of first electrode fingers 33 are separated from the second busbar 32. One example of the plurality of first electrode fingers 33 may preferably have the same or substantially the same length and the same or substantially the same width.

The plurality of second electrode fingers 34 are connected to the second busbar 32 and extend toward the first busbar 31. The plurality of second electrode fingers 34 extend from the second busbar 32 along the direction perpendicular or substantially perpendicular to the longitudinal direction of the second busbar 32. The ends of the plurality of second electrode fingers 34 are separated from the first busbar 31. One example of the plurality of second electrode fingers 34 may preferably have the same or substantially the same length and the same or substantially the same width. In the example illustrated in FIG. 2, the length and width of the plurality of second electrode fingers 34 are preferably, for example, the same or substantially the same as the length and width of the plurality of first electrode fingers 33, respectively.

In the IDT electrode 3, the plurality of first electrode fingers 33 and the plurality of second electrode fingers 34 are alternately arranged and spaced apart from each other in the direction perpendicular or substantially perpendicular to the direction in which the first busbar 31 and second busbar 32 face each other. Accordingly, a first electrode finger 33 and a second electrode finger 34 that are next to each other in the longitudinal direction of the first busbar 31 are separated from each other. The electrode-finger period of the IDT electrode 3 is the distance between the corresponding sides of the neighboring first and second electrode fingers 33 and 34. For the group of electrode fingers including the plurality of first electrode fingers 33 and the plurality of second electrode fingers 34, a configuration in which the plurality of first electrode fingers 33 and the plurality of second electrode fingers 34 are separately arranged in the second direction is merely required, and the group of electrode fingers may be configured such that the plurality of first electrode fingers 33 and the plurality of second electrode fingers 34 are separately but not alternately arranged. For example, the electrode fingers may be arranged in a mixed area of both a region in which the first electrode fingers 33 and the second electrode fingers 34 are spaced apart and alternately arranged and a region in which two first electrode fingers 33 or two second electrode fingers 34 are arranged next to each other in the second direction.

One example of the piezoelectric film 2 may preferably be made of lithium tantalite ($LiTaO_3$), lithium niobate ($LiNbO_3$), zinc oxide (ZnO), aluminum nitride (AlN), or PZT.

The film thickness of the piezoelectric film 2 is preferably not larger than about 3.5λ, for example, where λ indicates the wave length of an elastic wave defined by the electrode-finger period of the IDT electrode 3. When the film thickness of the piezoelectric film 2 is not larger than about 3.5λ, the elastic wave device 100 has a high Q value. When the film thickness of the piezoelectric film 2 is not larger than about 2.5λ, for example, the temperature coefficient of frequency (TCF) is good. When the film thickness of the piezoelectric film 2 is not larger than about 1.5λ, for example, the acoustic velocity is able to be easily adjusted.

The piezoelectric film 2 is disposed above the support substrate 1, as previously described. More specifically, a high acoustic velocity film 21 and a low acoustic velocity film 22 are disposed between the piezoelectric film 2 and the support substrate 1. The piezoelectric film 2, high acoustic velocity film 21, and low acoustic velocity film 22 are included in a multilayer film 20.

The high acoustic velocity film 21 is disposed on the support substrate 1. The acoustic velocity of a bulk wave travelling through the high acoustic velocity film 21 is higher than the acoustic velocity of an elastic wave travelling through the piezoelectric film 2. The low acoustic velocity film 22 is disposed on the high acoustic velocity film 21. The acoustic velocity of a bulk wave travelling through the low acoustic velocity film 22 is lower than the acoustic velocity of the elastic wave travelling through the piezoelectric film 2. The piezoelectric film 2 is disposed on the low acoustic velocity film 22.

In the elastic wave device 100, the high acoustic velocity film 21 prevents elastic waves from leaking to a structure below the high acoustic velocity film 21. In the elastic wave device 100, energy of an elastic wave in a specific mode used to obtain characteristics of a filter or a resonator is distributed over the piezoelectric film 2 and the low acoustic velocity film 22, is also distributed in a portion of the high acoustic velocity film 21 near the low acoustic velocity film 22, and is not distributed in the support substrate 1. The mechanism to trap elastic waves by the high acoustic velocity film 21 is similar to the mechanism for Love wave surface acoustic waves being non-leaky shear horizontal (SH) waves, and one example of that mechanism is described in Kenya Hashimoto, "Introduction to simulation technologies for surface acoustic wave devices," pp. 26-28, REALIZE Science & Engineering. The above-described mechanism differs from a mechanism to trap elastic waves using a Bragg reflector including acoustic multilayer films.

The high acoustic velocity film 21 may preferably be made of any of piezoelectric materials, including, for example, diamond-like carbon, aluminum nitride, aluminum oxide, silicon carbide, silicon nitride, silicon, sapphire, lithium tantalite, lithium niobite, and crystal, a variety of ceramic materials, including alumina, zirconia, cordierite, mullite, steatite, and forsterite, magnesia diamond, materials including any of the above-described materials, and materials including any mixture of the above-described materials.

Because the high acoustic velocity film 21 traps elastic waves in the piezoelectric film 2 and low acoustic velocity film 22, the film thickness of the high acoustic velocity film 21 may preferably be as large as possible.

The low acoustic velocity film 22 may preferably be made of, for example, any of compounds in which fluorine, carbon, or boron is added to silicon oxide, glass, silicon oxynitride, tantalum oxide, or silicon oxide or materials including any of the above-described materials.

When the low acoustic velocity film 22 is made of a silicon oxide, the temperature characteristics are able to be improved. The elastic constant of lithium tantalite ($LiTaO_3$) has negative temperature characteristics, and the elastic constant of the silicon oxide has positive temperature characteristics. Accordingly, the elastic wave device 100 is able to have a reduced absolute value of the TCF. In addition, the intrinsic acoustic impedance of the silicon oxide is smaller than that of lithium tantalite ($LiTaO_3$). Consequently, the elastic wave device 100 is able to achieve both an increased electromechanical coupling coefficient, that is, extending the fractional bandwidth and an improved TCF.

The film thickness of the low acoustic velocity film 22 may preferably be not larger than about 2.0λ, for example, where λ indicates the wave length of the elastic wave defined by the electrode-finger period of the IDT electrode 3. When the film thickness is not larger than about 2.0λ, the film stress is able to be reduced, and thus, warping of a wafer including a silicon wafer defining a base of the support substrate 1 during manufacture is able to be reduced. Accordingly, the first pass yield is able to be improved, and the characteristics are able to be stabilized.

The elastic wave device 100 further includes a protective film 23 covering the IDT electrode 3. The protective film 23 protects the IDT electrode 3. The IDT electrode 3 has electrical insulating properties. One example of the protective film 23 may preferably be made of silicon oxide. In the elastic wave device 100, the multilayer film 20, which includes the piezoelectric film 2, may preferably include a close-contact layer, a dielectric film, or other suitable layer, for example, as a film other than the high acoustic velocity film 21, the low acoustic velocity film 22, the piezoelectric film 2, and the protective film 23. For example, the multilayer film 20 may include a close-contact layer between the low acoustic velocity film 22 and piezoelectric film 2. In this case, the adhesion between the low acoustic velocity film 22 and piezoelectric film 2 is able to be improved. One example of the close-contact layer may preferably be made of a resin (e.g., epoxy resin, polyimide resin), a metal, or other material. The multilayer film 20 may include a dielectric film between the low acoustic velocity film 22 and piezoelectric film 2, on the piezoelectric film 2, or under the low acoustic velocity film 22.

The wiring electrodes 4 electrically connect the through electrodes 7 and the IDT electrode 3. The elastic wave device 100 includes the plurality of (two) wiring electrodes 4. In the elastic wave device 100, one wiring electrode 4 is electrically connected to the first busbar 31 in the IDT electrode 3, and the other wiring electrode 4 is electrically connected to the second busbar 32 in the IDT electrode 3. Each of the wiring electrodes 4 may preferably be made of, for example, an appropriate metal material, such as aluminum, copper, platinum, gold, silver, titanium, nickel, chromium, molybdenum, tungsten, or an alloy including any of these metals. The wiring electrode 4 may have a structure in which a plurality of metal films made of these metals or alloys are laminated.

The wiring electrode 4 overlaps a portion of the IDT electrode 3, a portion of the piezoelectric film 2, and a portion of the insulating layer 9 in the thickness direction D1 of the support substrate 1. In the elastic wave device 100 according to the first preferred embodiment, the through electrode 7 is disposed on the first section 41 of the wiring electrode 4, and the first section 41 is disposed on the insulating layer 9. That is, the first section 41 of the wiring electrode 4 overlaps the through electrode 7 in the thickness direction D1. The wiring electrode includes a connection portion 44 extending from the second section 42 disposed on the piezoelectric film 2 to the IDT electrode 3. The connection portion 44 of the wiring electrode 4 is disposed on the IDT electrode 3. Thus, the wiring electrode 4 is electrically connected to the IDT electrode 3. The wiring electrode 4 is electrically connected to the through electrode 7 disposed on the first section 41. The wiring electrode 4 is positioned inside the outer edge of the insulating layer 9 as seen in the plan view from the thickness direction D1.

Because the piezoelectric film 2 and external connection electrodes 17 do not overlap each other as seen in the plan view from the thickness direction of the support substrate 1, the elastic wave device 100 according to the first preferred embodiment has a structure in which the piezoelectric film 2 is not present in a position overlapping the through electrodes 7 as seen in the plan view from the thickness direction D1 of the support substrate 1 in order to prevent cracking or chipping in the piezoelectric film 2 caused by force applied to the piezoelectric film 2 from the through electrodes 7 or external connection terminals 8 in a process of forming the through electrodes 7 and in a process of forming the external connection terminals 8 during manufacture. Therefore, the wiring electrode 4 includes a step portion 431 defining a step in the thickness direction D1 of the support substrate 1 between the first section 41 and second section 42 (hereinafter also referred to as first step portion 431). The first step portion 431 is laterally spaced apart from the piezoelectric film 2. In the first step portion 431, the distance from the front surface 11 of the support substrate 1 in the thickness direction D1 gradually increases along the direction from the first section 41 toward the second section 42. The wiring electrode 4 includes a section disposed above the piezoelectric film 2 with the insulating layer 9 interposed therebetween (section near the step portion 431), and this section is a second step portion 432 defining the step in the thickness direction D1 of the support substrate 1. In the second step portion 432, the distance from the front surface 11 of the support substrate 1 in the thickness direction D1 gradually decreases along the direction from the first section 41 toward the second section 42. The wiring electrode 4 includes a bent portion 43 including the first step portion 431 and second step portion 432 and projecting toward the cover layer 6 in the thickness direction D1 of the support substrate 1.

The insulating layer 9 has electrical insulating properties. As illustrated in FIGS. 1 and 2, the insulating layer 9 is disposed along the outer edge of the support substrate 1 on the front surface 11 of the support substrate 1. The insulating layer 9 surrounds the side surface of the multilayer film 20. The plan-view shape of the insulating layer 9 is preferably a frame shape (e.g., a rectangular or substantially rectangular frame shape). A portion of the insulating layer 9 overlaps the outer edge portion of the multilayer film 20 in the thickness direction D1 of the support substrate 1. The side surface of the multilayer film 20 is covered by the insulating layer 9.

An example material of the insulating layer 9 may preferably be a synthetic resin, such as an epoxy resin or polyimide. The difference between the coefficient of linear expansion of the insulating layer 9 and that of the support substrate 1 is larger than the difference between the coefficient of linear expansion of the piezoelectric film 2 and that of the support substrate 1.

The spacer layer 5 includes a through hole 55. The spacer layer 5 is disposed outside the IDT electrode 3 as seen in the plan view from the thickness direction D1 of the support substrate 1 and surrounds the IDT electrode 3. The spacer layer 5 extends along the outer edge of the support substrate 1 as seen in the plan view from the thickness direction D1 of the support substrate 1. The plan-view shape of the spacer layer 5 is preferably a frame shape, for example. One example of each of the outer edge shape and the inner edge shape of the spacer layer 5 may be rectangular or substantially rectangular. The spacer layer 5 overlaps the insulating layer 9 in the thickness direction D1 of the support substrate 1. The spacer layer 5 includes an end portion 51 near the support substrate 1 (first end positioned near the support substrate 1 in the thickness direction D1 of the support substrate 1) and an end portion 52 near the cover layer 6 (second end positioned near the cover layer 6 in the thickness direction D1 of the support substrate 1). The outer circumference of the spacer layer 5 is smaller than that of the insulating layer 9. The inner circumference of the spacer layer 5 is larger than that of the insulating layer 9. A portion of the spacer layer 5 also covers the wiring electrodes 4 on the insulating layer 9. The spacer layer 5 includes a first section disposed on the insulating layer 9 and a second section disposed above the insulating layer 9 with the wiring electrodes 4 interposed therebetween. The first section of the spacer layer 5 extends around the entire or substantially entire circumference of the insulating layer 9 on the insulating layer 9.

The spacer layer 5 has electrical insulating properties. An example material of the spacer layer 5 may preferably be a synthetic resin, such as an epoxy resin or polyimide. The material of the spacer layer 5 may preferably include the same or substantially the same principal material as that of the insulating layer 9, and more preferably include the same material as that of the insulating layer 9.

The sum of the thickness of the spacer layer 5 and that of the insulating layer 9 is preferably larger than the sum of the thickness of the multilayer film 20, that of the IDT electrode 3, and that of the protective film 23.

The spacer layer 5 covers the first step portion 431 as seen in the plan view from the thickness direction D1 of the support substrate 1. The spacer layer 5 covers a portion of the bent portion 43 as seen in plan view from the thickness direction D1 of the support substrate 1.

The cover layer 6 is preferably flat or substantially flat. The plan-view shape of the cover layer 6 (outer edge shape as seen in plan view from the thickness direction D1 of the support substrate 1) may preferably be, but not limited to, a rectangular or substantially rectangular shape. Another example of the shape may be a square or substantially square shape. The outer circumference of the cover layer 6 is preferably the same or approximately the same size as that of the support substrate 1. The cover layer 6 is disposed on the spacer layer 5 such that it blocks the through hole 55 in the spacer layer 5. The cover layer 6 is separated from the IDT electrode 3 in the thickness direction D1 of the support substrate 1. The cover layer 6 is separated from the protective film 23 in the thickness direction D1 of the support substrate 1. The cover layer 6 has electrical insulating properties. The material of the cover layer 6 preferably includes a resin, for example.

The cover layer 6 includes a first principal surface 63 and a second principal surface 65 on opposite sides in the thickness direction (the same as the thickness direction D1 of the support substrate 1). In the cover layer 6, the first principal surface 63 is preferably nearer to the support substrate 1 than the second principal surface 65. That is, the distance between the first principal surface 63 and the support substrate 1 is preferably shorter than that between the second principal surface 65 and the support substrate 1. In the elastic wave device 100, the end portion 52, which is near the cover layer 6 in the space layer 5, is embedded in the cover layer 6. From a different viewpoint, in the elastic wave device 100 according to the first preferred embodiment, as seen from the thickness direction of the cover layer 6, the spacer layer 5 is positioned inside the outer edge of the cover layer 6, and as seen from a direction perpendicular or substantially perpendicular to the thickness direction of the cover layer 6, the cover layer 6 overlaps the end portion 52, which is near the cover layer 6 in the space layer 5. In the elastic wave device 100, the cover layer 6 includes a recessed portion 64 in the first principal surface 63. The recessed portion 64 is separated from the outer edge of the first principal surface 63, and is in a region overlapping the spacer layer 5 as seen in plan view from the thickness direction D1. The end portion 52, which is near the cover layer 6 in the spacer layer 5, is embedded in the recessed portion 64. In other words, the end portion 52, which is near the cover layer 6 in the spacer layer 5, is fit in the recessed portion 64. The recessed portions 64 preferably has the same or substantially the same frame shape as that of the spacer layer 5 as seen in plan view from the thickness direction D1 of the support substrate 1. The cover layer 6 is fixed to the spacer layer 5. In the elastic wave device 100 according to the first preferred embodiment, at least a portion of the side surface of the end portion 52, which is near the cover layer 6 in the spacer layer 5, may preferably be in contact with the inner side surface of the recessed portion 64 of the cover layer 6. The side surface of the end portion 52 may preferably be in contact with the inner side surface of the recessed portion 64 of the cover layer 6 around its perimeter.

The cover layer 6 includes a first sublayer 61 and a second sublayer 62. The second sublayer 62 is disposed on the first sublayer 61. The first sublayer 61 is nearer to the support substrate 1 than the second sublayer 62. In the cover layer 6, the Young's modulus of the first sublayer 61 is preferably larger than that of the second sublayer 62. In the cover layer 6, the second sublayer 62 is laminated on the first sublayer 61. One example material of the first sublayer 61 may preferably be an epoxy-based resin. Examples of the epoxy-based resin may include an epoxy resin and an epoxy resin with silicone-based rubber added thereto. One example material of the second sublayer 62 may preferably be a polyimide-based resin. The material of the first sublayer 61 may preferably include the same principal material as that of the spacer layer 5, and more preferably include the same material thereof. The material of the first sublayer 61 is not limited to the epoxy-based resin, and it may be a phenol resin. The material of the second sublayer 62 is not limited to the polyimide-based resin, and other examples thereof may include a silicone resin, polytetrafluoroethylene (PTFE), and liquid crystal polymer (LCP).

The thickness of the first sublayer 61 may preferably be between about 12 μm and about 25 μm, for example, and one example thickness may be about 20 μm. The thickness of the second sublayer 62 may preferably be between about 12 μm and about 25 μm, for example, and one example thickness may be about 20 μm. In the cover layer 6, the depth of the recessed portion 64 is not larger than the thickness of the first sublayer 61, and one example depth may preferably be about 5.2 μm. When the depth of the recessed portion 64 is the same or substantially the same as the thickness of the first sublayer 61, the depth of the end portion 52 embedded in the cover layer 6, the end portion 52, which is near the cover layer 6 in the spacer layer 5, is larger than that in the case in which the depth of the recessed portion 64 is less than the thickness of the first sublayer 61. In the elastic wave device 100 according to the first preferred embodiment, the depth of the recessed portion 64 of the cover layer 6 is preferably the same or substantially the same as the depth of the end portion 52 embedded in the cover layer 6, the end portion 52, which is near the cover layer 6 in the spacer layer 5.

The elastic wave device 100 includes a space S1 surrounded by the cover layer 6, spacer layer 5, insulating layer 9, and the multilayer body on the support substrate 1 (multilayer body including the multilayer film 20, IDT electrode 3, and protective film 23). In the elastic wave device 100, the space S1 is filled with gas. Examples of the gas may preferably include the air and inert gas (e.g., $N_2$ gas).

The elastic wave device 100 includes the plurality of (two or more) external connection electrodes 17 each including the through electrode 7 and external connection terminal 8. The external connection electrodes 17 electrically connect the elastic wave device 100 to an external mounting board or other suitable structure, such as a circuit board. The elastic wave device 100 may include a plurality of (two) mounting electrodes 18 (see FIG. 2) not electrically connected to the IDT electrode 3. The mounting electrodes 18 improve parallelism of the elastic wave device 100 to the mounting board or other suitable structure and are different from the electrodes dedicated to electrical connection. That is, the mounting electrodes 18 reduce or prevent inclined mounting of the elastic wave device 100 on the mounting board or other suitable structure, and they may be absent, depending on the number and arrangement of the external connection electrodes 17, the outer edge shape of the elastic wave device 100, or other factors. One example of the circuit board defining the mounting board may be a printed wiring board. The coefficient of linear expansion of the printed wiring board may preferably be about 15 ppm/° C., for example. The printed wiring board may preferably be made of a glass fabric-based epoxy resin copper-clad laminate, for example.

In the elastic wave device 100, as seen in plan view from the thickness direction D1 of the support substrate 1, the two external connection electrodes 17 are disposed on two corner portions opposed to each other of the four corner portions of the cover layer 6, respectively, and the two mounting electrodes 18 are disposed on the remaining two corner portions, respectively. In the elastic wave device 100, as seen in the plan view from the thickness direction D1 of the support substrate 1, the two external connection electrodes 17 and the two mounting electrodes 18 do not overlap the multilayer film 20.

The through electrode 7 in each of the external connection electrodes 17 extends through the spacer layer 5 and cover layer 6 in the thickness direction D1 of the support substrate 1. The through electrode 7 is disposed on the wiring electrode 4 and is electrically connected to the wiring electrode 4. The through electrode 7 defines an under-bump metal layer. The external connection electrode 17 further includes the external connection terminal 8 disposed on the through electrode 7. One example of the external connection terminal 8 may preferably be a bump. The external connection terminal 8 has conductivity. The external connection terminal 8 is joined to the through electrode 7 and is electrically connected to the through electrode 7. Each of the mounting electrodes 18 includes a through electrode extending through the spacer layer 5 and cover layer 6 in the thickness direction D1 of the support substrate 1. The mounting electrode 18 further includes a bump disposed on the through electrode.

One example of the through electrode 7 may preferably be made of an appropriate metal material, such as copper, nickel, or an alloy including any one of these metals. One example of the external connection terminal 8 may preferably be made of solder, gold, copper, or other material. The through electrode in the mounting electrode 18 is preferably made of the same or substantially the same material as that of the through electrode in the external connection electrode 17. The bump in the mounting electrode 18 preferably is made of the same or substantially the same material as that of the external connection terminal 8 in the external connection electrode 17.

One non-limiting example of a method for manufacturing the elastic wave device 100 is briefly described below.

In the method for manufacturing the elastic wave device 100, first, a silicon wafer that is to be a base of the support substrate 1 of each of a plurality of elastic wave devices 100 is prepared.

In the method for manufacturing the elastic wave device 100, the multilayer film 20 is formed on the front surface of the silicon wafer, and then, the insulating layer 9 and the spacer layer 5 are formed in sequence. After that, in the method for manufacturing the elastic wave device 100, the cover layer 6 including the recessed portion 64 formed in the first principal surface 63 is joined to the spacer layer 5 such that it blocks the through hole 55 in the spacer layer 5. Then, in the method for manufacturing the elastic wave device 100, through holes are formed in the multilayer body including the cover layer 6 and spacer layer 5 in positions in which the through electrodes 7 are to be formed, the through electrodes 7 are formed so as to be fit in the through holes, and the external connection terminals 8 are formed on the through electrodes 7. In this manner, with the method for manufacturing the elastic wave device 100, a wafer in which the plurality of elastic wave devices 100 are formed on the silicon wafer is obtained. The front surface of the silicon wafer corresponds to the front surface 11 of the support substrate 1 (that is, front surface of the silicon substrate). In the process for forming the recessed portion 64 in the first principal surface 63 of the cover layer 6, the recessed portion 64 may be formed by, for example, using laser processing technology, photolithographic technology, or other technology.

In the method for manufacturing the elastic wave device 100, a plurality of elastic wave devices 100 may be obtained from a single wafer by a dicing process of cutting the wafer with a dicing machine. In the dicing process, a dicing saw may be used.

For the elastic wave device 100 in the first preferred embodiment, the depths of the recessed portion 64 in the cover layer 6 (depths of the end portion 52 embedded in the cover layer 6, the end portion 52 being near the cover layer 6 in the spacer layer 5) according to Examples 1, 2, 3, 4, 5, 6, 7, and 8, are about 2.0 μm, about 2.3 μm, about 2.8 μm, about 3.6 μm, about 4.0 μm, about 5.2 μm, about 6.3 μm, and about 6.6 μm, respectively. In Examples 1 to 8, the thickness of the first sublayer 61 is about 20 μm, and the thickness of the second sublayer 62 is about 20 μm. In the elastic wave device 100 according to each of Examples 1 to 8, the support substrate 1 is a silicon substrate. In the elastic wave device 100 according to each of Examples 1 to 8, the material of the high acoustic velocity film 21 is silicon nitride, that of the low acoustic velocity film 22 is silicon oxide, that of piezoelectric film 2 is lithium tantalite ($LiTaO_3$), and that of the protective film 23 is silicon oxide. In the elastic wave device 100 according to each of Examples 1 to 8, the material of the IDT electrode 3 is aluminum, and that of the insulating layer 9 is an epoxy resin. In the elastic wave device 100 according to each of Examples 1 to 8, the material of the spacer layer 5 is an epoxy resin, that of the first sublayer 61 in the cover layer 6 is an epoxy resin, and that of the second sublayer 62 in the cover layer 6 is polyimide. In the elastic wave device 100 according to each of Examples 1 to 8, the material of the through electrode 7 is copper, and that of the external connection terminal 8 is solder.

The elastic wave device according to a comparative example differs from the elastic wave device 100 according to each of Examples 1 to 8 in that the cover layer 6 does not include the recessed portion 64 in the elastic wave device 100 according to the first preferred embodiment and that the end portion 52, which is near the cover layer 6 in the spacer layer 5, is not embedded in the cover layer 6.

Results of a thermal shock test performed on the elastic wave device 100 according to each of Examples 1 to 8 and the elastic wave device according to the comparative example are described below. The thermal shock test is a twin-liquid tank temperature change test based on JIS C 60068-2-14 and IEC 60068-2-14. In the twin-liquid tank temperature change test, the temperature of liquid inside a low-temperature liquid tank is about −55° C., and that inside a high-temperature liquid tank is about 125° C. In the twin-liquid tank temperature change test, the immersion time of a specimen in the liquid inside the low-temperature liquid tank is about 15 minutes, and that inside the high-temperature liquid tank is about 15 minutes. The thermal shock test is conducted in the state in which each of the elastic wave device 100 according to each of Examples 1 to 8 and the elastic wave device according to the comparative example is mounted on a mounting board. The mounting board is a printed circuit board. The coefficient of linear expansion of the mounting board is about 15 ppm/° C. The coefficient of linear expansion of the mounting board used here is the coefficient of linear expansion of an insulating substrate in the printed circuit board defining the mounting board. The coefficient of linear expansion of the support substrate 1 is about 4 ppm/° C., for example.

Figure 3:
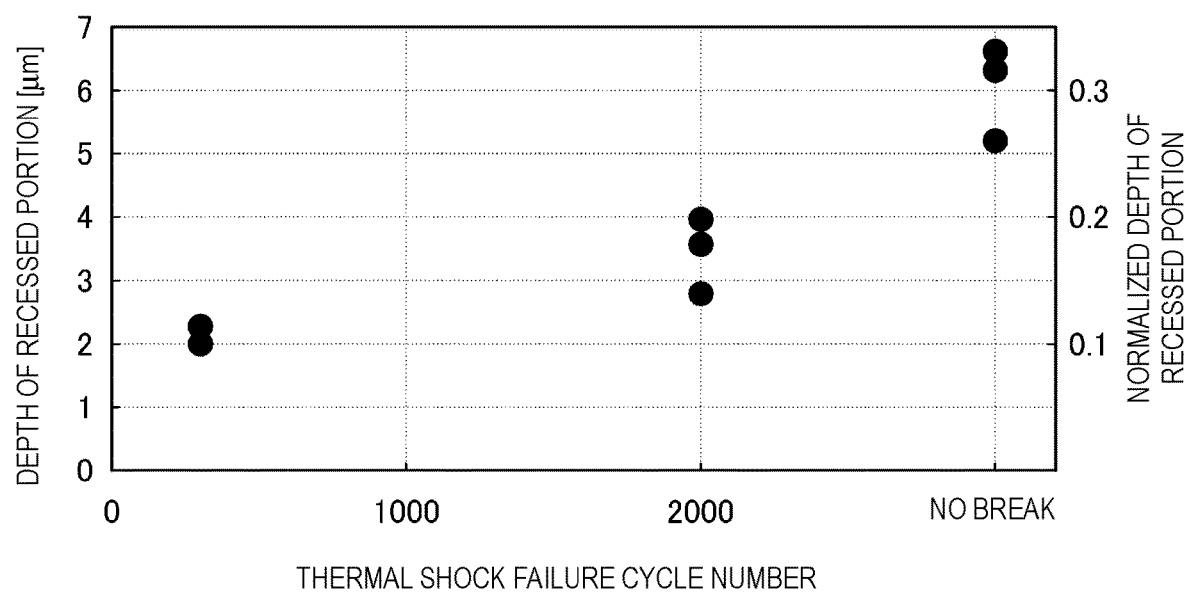
FIG. 3 is a graph that illustrates results of a thermal shock test for the elastic wave device.

For the elastic wave device 100 according to each of Examples 1 to 8 and the elastic wave device according to the comparative example, the presence or absence of a break in the wiring electrodes 4 when the thermal shock cycle number is about 300 is checked, then, the presence or absence of a break in the wiring electrodes 4 when the thermal shock cycle number is about 1000 is checked, and then, the presence or absence of a break in the wiring electrodes 4 when the thermal shock cycle number is about 2000 is checked. The results are illustrated in FIG. 3. In FIG. 3, the left vertical axis indicates the depth of the recessed portion 64, the right vertical axis indicates the normalized depth of the recessed portion ([depth of recessed portion 64]/[thickness of first sublayer 61]), and the horizontal axis indicates the thermal shock failure cycle number. The "thermal shock failure cycle number" used here is the thermal shock cycle number when the occurrence of a break in the wiring electrodes 4 is found (break occurred). "No Break" in FIG. 3 means that no break occurs when the thermal shock cycle number is about 2000. The presence or absence of a break in the wiring electrodes 4 for each of the samples (elastic wave device 100 according to each of Examples 1 to 8 and elastic wave device according to the comparative example) is determined based on a measurement of electrical characteristics. For a sample in which it is determined that a break occurred, the occurrence of the break in the wiring electrodes 4 is checked using cross-sectional scanning electron microscope (SEM) images.

For the elastic wave device according to the comparative example, which does not include the recessed portion 64, it is determined that a break occurred in the wiring electrodes 4 at the time of checking when the thermal shock cycle number is about 300. In contrast, for the elastic wave device 100 according to each of Examples 1 and 2, in which the depths of the recessed portion 64 are about 2.0 μm and about 2.3 μm, respectively, it is determined that a break occurred in the wiring electrodes 4 at the time of checking when the thermal shock cycle number is about 2000. For the elastic wave device 100 according to each of Examples 3, 4, and 5, in which the depths of the recessed portion 64 are about 2.8 µm, about 3.6 µm, and about 4.0 µm, respectively, it is determined that a break occurred in the wiring electrodes 4 at the time of checking when the thermal shock cycle number is about 2000. For the elastic wave device 100 according to each of Examples 6, 7, and 8, in which the depths of the recessed portion 64 are about 5.2 µm, about 6.3 µm, and about 6.6 µm, respectively, it is determined that no break occurred in the wiring electrodes 4 at the time of checking when the thermal shock cycle number is about 2000. FIG. 3 shows that the reliability of the wiring electrodes 4 and ability to withstand the thermal shock test in the elastic wave device 100 according to each of Examples 1 to 8, in which the cover layer 6 includes the recessed portion 64 and the end portion 52, which is near the cover layer 6 in the spacer layer 5, is embedded therein, is improved, in comparison with that in the elastic wave device according to the comparative example. It is also shown that when the depth of the recessed portion 64 is about 5.2 µm or more (the normalized depth of the recessed portion 64 is about 0.26 or more), the reliability of the wiring electrodes 4 and ability to withstand the thermal shock test is further improved, in comparison with that in the cases where the depth of the recessed portion is less than about 5.2 µm (the normalized depth of the recessed portion 64 is less than about 0.26).

The elastic wave device 100 according to the first preferred embodiment includes the support substrate 1, the piezoelectric film 2, the IDT electrode 3 (functional electrode), the wiring electrodes 4, the spacer layer 5, the cover layer 6, the through electrodes 7, and the external connection terminals 8. The piezoelectric film 2 is included in the multilayer film 20. The piezoelectric film 2 is disposed above the support substrate 1. The IDT electrode 3 is disposed on the piezoelectric film 2. The wiring electrodes 4 are electrically connected to the IDT electrode 3. The spacer layer 5 is disposed above the support substrate 1, and is disposed outside the piezoelectric film 2 as seen in plan view from the thickness direction D1 of the support substrate 1. The cover layer 6 includes the first principal surface 63 and the second principal surface 65 on opposite sides in the thickness direction D1. The cover layer 6 is disposed on the spacer layer 5. The through electrodes 7 extend through the spacer layer 5 and the cover layer 6 and are electrically connected to the wiring electrodes 4. The external connection terminals 8 are electrically connected to the through electrodes 7. Each of the wiring electrodes 4 includes the first section 41 overlapping the through electrode 7 as seen in the plan view from the thickness direction D1, the second section 42 overlapping the piezoelectric film 2 as seen in the plan view from the thickness direction D1, and the step portion 431 defining the step in the thickness direction D1 between the first section 41 and second section 42. In the cover layer 6, the first principal surface 63 is nearer the spacer layer 5 than the second principal surface 65. The cover layer 6 includes the recessed portion 64 in the first principal surface 63 in the region overlapping the spacer layer 5 as seen in the plan view from the thickness direction D1. The spacer layer 5 is embedded in the recessed portion 64.

In an elastic wave device in which a spacer layer is disposed on a piezoelectric film layer, a wiring electrode electrically connecting an IDT electrode disposed on the piezoelectric film layer and a through electrode extending through the spacer layer often includes no step portion. Such an elastic wave device may include cracks or chips in the piezoelectric film occurring at the time of manufacturing the elastic wave device or the time of mounting the elastic wave device on a mounting board.

In contrast, in the elastic wave device 100 according to the first preferred embodiment, the spacer layer 5 is disposed outside the piezoelectric film 2 as seen in the plan view from the thickness direction D1 of the support substrate 1. That is, the piezoelectric film 2 is separated from the outer edge of the support substrate 1 as seen in the plan view from the thickness direction D1. The spacer layer 5, the through electrodes 7, and the piezoelectric film 2 do not overlap as seen in the plan view from the thickness direction D1 of the support substrate 1.

Accordingly, in the elastic wave device 100 according to the first preferred embodiment, the occurrence of cracking and chipping of the piezoelectric film 2 is able to be reduced or prevented.

However, for the elastic wave device 100, because the spacer layer 5 is disposed outside the piezoelectric film 2 when the elastic wave device 100 is seen in the plan view from the thickness direction D1 of the support substrate 1, the wiring electrode 4 electrically connecting the IDT electrode 3 disposed on the piezoelectric film 2 and the through electrode 7 extending through the spacer layer 5 includes the first step portion 431 between the first section 41 overlapping the through electrode 7 and the second section 42 overlapping the piezoelectric film 2.

A reason for the occurrence of a break in a wiring electrode in a thermal shock test on the elastic wave device according to the comparative example, in which the cover layer 6 does not include the recessed portion 64, is described below. Because the spacer layer moves in a direction perpendicular or substantially perpendicular to the thickness direction of the support substrate due to the difference in the coefficient of linear expansion between the support substrate and the mounting board or other factor, a stress concentrates on the step portion in the wiring electrode, and a break occurs in the wiring electrode. In contrast, in the elastic wave device 100 according to the first preferred embodiment, because the end portion 52, which is near the cover layer 6 in the spacer layer 5, is embedded in the cover layer 6, movement of the spacer layer 5 in the direction perpendicular or substantially perpendicular to the thickness direction of the support substrate 1 due to the difference in the coefficient of linear expansion between the support substrate 1 and mounting board or other factor is able to be reduced or prevented, and thus concentration of the stress on the first step portion 431 of the wiring electrode 4 is able to be reduced or prevented. Thus, the reliability of the wiring electrode 4 and ability to withstand the thermal shock test in the elastic wave device 100 according to the first preferred embodiment is able to be increased, and the occurrence of breaks in the wiring electrodes 4 is reduced.

The cover layer 6 in the elastic wave device 100 according to the first preferred embodiment includes the first sublayer 61 and second sublayer 62. The second sublayer 62 is disposed on the first sublayer 61. The first sublayer 61 is nearer the support substrate 1 than the second sublayer 62. The Young's modulus of the first sublayer 61 is larger than that of the second sublayer 62. Thus, in the elastic wave device 100 according to the first preferred embodiment, the spacer layer 5 is more securely supported by the first sublayer 61 in the cover layer 6.

In the elastic wave device 100 according to the first preferred embodiment, the depth of the end portion 52 embedded in the cover layer 6, the end portion 52, which is near the cover layer 6 in the spacer layer 5, is not larger than the thickness of the first sublayer 61. Thus, in the elastic wave device 100 according to the first preferred embodiment, the spacer layer 5 is more securely supported by the cover layer 6 than that in the case in which the depth of the end portion 52 embedded in the cover layer 6, which is included in the spacer layer 5 and near the cover layer 6, is larger than the thickness of the first sublayer 61.

In the elastic wave device 100 according to the first preferred embodiment, the spacer layer 5 at least partially overlaps the first step portions 431 as seen in the plan view from the thickness direction D1. Thus, the reliability of the wiring electrode 4 and ability to withstand the thermal shock test in the elastic wave device 100 according to the first preferred embodiment is able to be further improved, in comparison with that in the case in which the spacer layer 5 does not at least partially overlap the first step portions 431 of the wiring electrode 4.

The elastic wave device 100 according to the first preferred embodiment further includes the insulating layer 9 disposed on the support substrate 1. The support substrate 1 is preferably a silicon substrate, for example. In the elastic wave device 100, a portion of the wiring electrode 4 is disposed on the insulating layer 9. The spacer layer 5 is disposed on the wiring electrode 4 and the insulating layer 9. The through electrode 7 is disposed on the wiring electrode 4. Accordingly, in the elastic wave device 100 according to the first preferred embodiment, the wiring electrode 4 and the support substrate 1 are electrically insulated from each other by the insulating layer 9, and the reliability of the wiring electrode 4 and ability to withstand the thermal shock test is able to be further improved.

Second Preferred Embodiment

Figure 4:
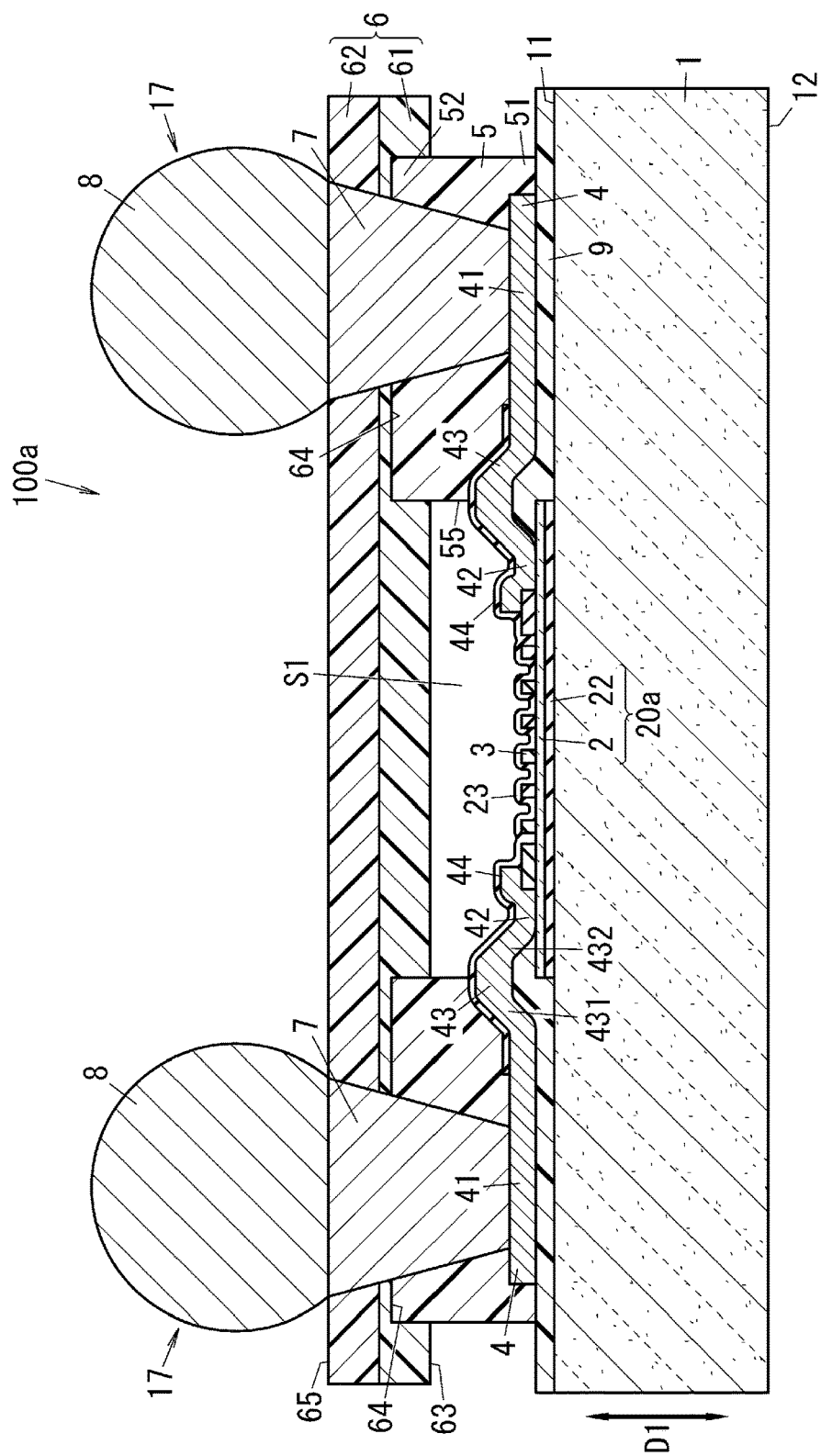
FIG. 4 is a cross-sectional view of an electronic component module according to a second preferred embodiment of the present invention.

An elastic wave device 100a according to a second preferred embodiment of the present invention differs from the elastic wave device 100 according to the first preferred embodiment in that a multilayer film 20a including the piezoelectric film 2 does not include the high acoustic velocity film 21 in the elastic wave device 100 according to the first preferred embodiment, as illustrated in FIG. 4. The same reference numerals are used to denote the same or similar elements in the elastic wave device 100a according to the second preferred embodiment as those in the elastic wave device 100 according to the first preferred embodiment, and they are not described here.

In the elastic wave device 100a according to the second preferred embodiment, the support substrate 1 supporting the multilayer film 20a including the low acoustic velocity film 22 and the piezoelectric film 2 defines a high acoustic velocity support substrate. Accordingly, in the elastic wave device 100a, the piezoelectric film 2 is disposed above the support substrate 1, which defines the high acoustic velocity support substrate.

In the high acoustic velocity support substrate, the lowest acoustic velocity of bulk waves travelling therein is higher than the acoustic velocity of an elastic wave travelling in the piezoelectric film 2.

In the elastic wave device 100a, because the low acoustic velocity film 22 is disposed between the support substrate 1, which is the high acoustic velocity support substrate, and the piezoelectric film 2, the acoustic velocity of the elastic wave decreases. Intrinsically, the elastic wave concentrates its energy on a medium with a low acoustic velocity. Accordingly, the advantage of trapping the elastic wave energy in the piezoelectric film 2 and in the IDT electrode 3 in which the elastic wave is excited is able to be improved. Thus, the loss is able to be reduced, and the Q value is able to be increased, in comparison with the case in which the low acoustic velocity film 22 is not provided. The multilayer film 20a may include a close-contact layer between the low acoustic velocity film 22 and the piezoelectric film 2 as a film other than the low acoustic velocity film 22 and the piezoelectric film 2. In this case, the adhesion between the low acoustic velocity film 22 and the piezoelectric film 2 is able to be improved. The close-contact layer may preferably be made of a resin (e.g., epoxy resin, polyimide resin), a metal, or other suitable material. The multilayer film 20a may include a layer other than close-contact layer, and it may include a dielectric film between the low acoustic velocity film 22 and the piezoelectric film 2, on the piezoelectric film 2, or under the low acoustic velocity film 22.

In the elastic wave device 100a according to the second preferred embodiment, the end portion 52, which is near the cover layer 6 in the spacer layer 5, is embedded in the cover layer 6, as in the case of the elastic wave device 100 according to the first preferred embodiment. Thus, the reliability of the wiring electrode 4 and ability to withstand the thermal shock test in the elastic wave device 100a according to the second preferred embodiment is able to be improved. In the elastic wave device 100a according to the second preferred embodiment, the cover layer 6 includes the recessed portion 64 in the first principal surface 63 in the region overlapping the spacer layer 5 as seen in the plan view from the thickness direction D1, as in the case of the elastic wave device 100 according to the first preferred embodiment. The end portion 52, which is near the cover layer 6 in the spacer layer 5, is embedded in the recessed portion 64. Accordingly, the reliability of the wiring electrode 4 and ability to withstand the thermal shock test in the elastic wave device 100a according to the second preferred embodiment is able to be improved.

Third Preferred Embodiment

Figure 5:
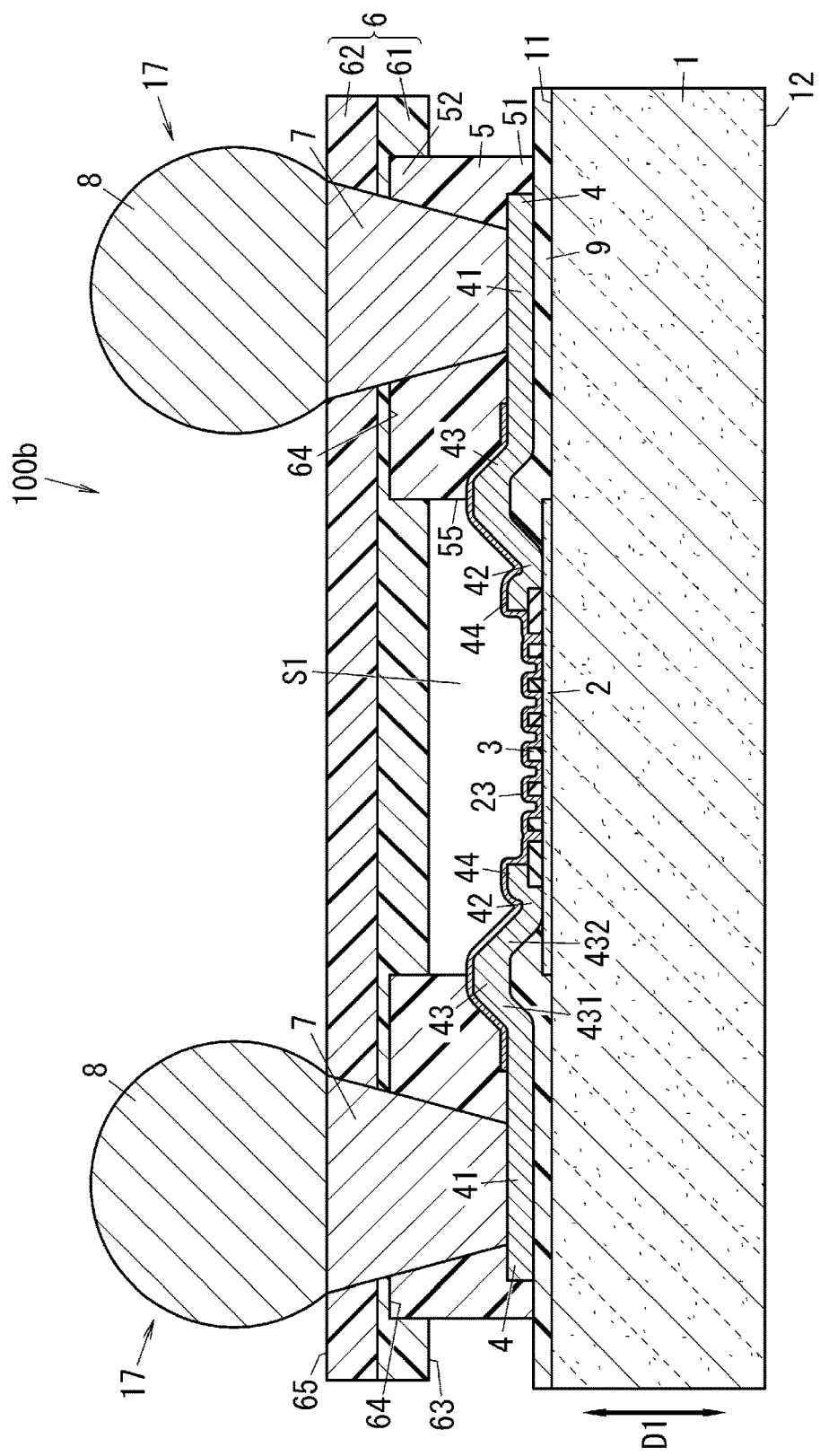
FIG. 5 is a cross-sectional view of an electronic component module according to a third preferred embodiment of the present invention.

An elastic wave device 100b according to a third preferred embodiment of the present invention is described below with reference to FIG. 5.

The elastic wave device 100b according to the third preferred embodiment differs from the elastic wave device 100 according to the first preferred embodiment in that it does not include the high acoustic velocity film 21 or low acoustic velocity film 22 in the elastic wave device 100 according to the first preferred embodiment. The same reference numerals are used in the same elements in the elastic wave device 100b according to the third preferred embodiment as those in the elastic wave device 100 according to the first preferred embodiment, and are not described here.

In the elastic wave device 100b according to the third preferred embodiment, the piezoelectric film 2 is disposed on the support substrate 1. In the elastic wave device 100b according to the third preferred embodiment, the support substrate 1 defines a high acoustic velocity support substrate in which the acoustic velocity of a bulk wave travelling therein is higher than the acoustic velocity of the elastic wave travelling in the piezoelectric film 2. The thickness of the spacer layer 5 is preferably larger than the sum of the thickness of the piezoelectric film 2, that of the IDT electrode 3, and that of the protective film 23.

The elastic wave device 100b may include a close-contact layer or dielectric film on the piezoelectric film 2 on a side near the support substrate 1. The elastic wave device 100b may include a dielectric film or other suitable film on the piezoelectric film 2 on the other side near the IDT electrode 3.

In the elastic wave device 100b according to the third preferred embodiment, the end portion 52, which is near the cover layer 6 in the spacer layer 5, is embedded in the cover layer 6, as in the case of the elastic wave device 100 according to the first preferred embodiment. Thus, the reliability of the wiring electrode 4 and ability to withstand the thermal shock test in the elastic wave device 100b according to the third preferred embodiment is able to be improved. In the elastic wave device 100b according to the third preferred embodiment, the cover layer 6 includes the recessed portion 64 in the first principal surface 63 in the region overlapping the spacer layer 5 as seen in plan view from the thickness direction D1, as in the case of the elastic wave device 100 according to the first preferred embodiment. The end portion 52, which is near the cover layer 6 in the spacer layer 5, is embedded in the recessed portion 64. Accordingly, the reliability of the wiring electrode 4 and ability to withstand the thermal shock test in the elastic wave device 100b according to the third preferred embodiment is able to be improved.

Fourth Preferred Embodiment

Figure 6:
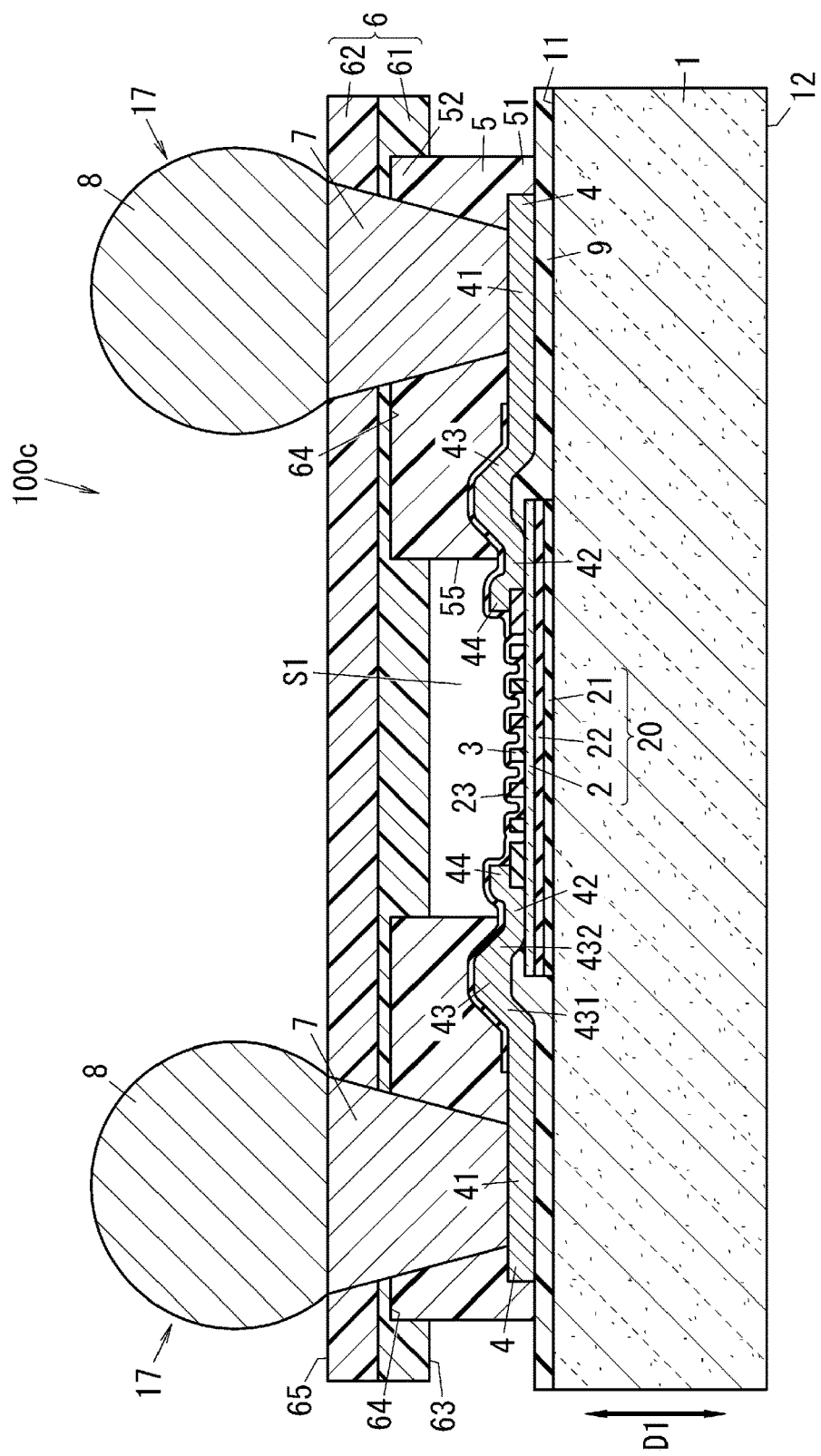
FIG. 6 is a cross-sectional view of an electronic component module according to a fourth preferred embodiment of the present invention.

An elastic wave device 100c according to a fourth preferred embodiment of the present invention is described below with reference to FIG. 6.

The elastic wave device 100c according to the fourth preferred embodiment differs from the elastic wave device 100 according to the first preferred embodiment in that the region in which the spacer layer 5 is disposed as seen in the plan view from the thickness direction D1 of the support substrate 1 is different. The same reference numerals are used to denote the same or similar elements in the elastic wave device 100c according to the fourth preferred embodiment as those in the elastic wave device 100 according to the first preferred embodiment, and are not described here.

The spacer layer 5 in the elastic wave device 100c according to the fourth preferred embodiment overlaps both of the first step portion 431 and second step portion 432 as seen in the plan view from the thickness direction D1. Thus, the elastic wave device 100c according to the fourth preferred embodiment is able to reduce or prevent concentration of a stress on the bent portion 43 in the wiring electrode 4, and the reliability of the wiring electrode 4 and ability to withstand the thermal shock test is able to be further improved, in comparison with the elastic wave device 100 according to the first preferred embodiment. The spacer layer 5 in the elastic wave device 100c according to the fourth preferred embodiment entirely or substantially entirely covers the bent portion 43 as seen in the plan view from the thickness direction D1.

Fifth Preferred Embodiment

Figure 7:
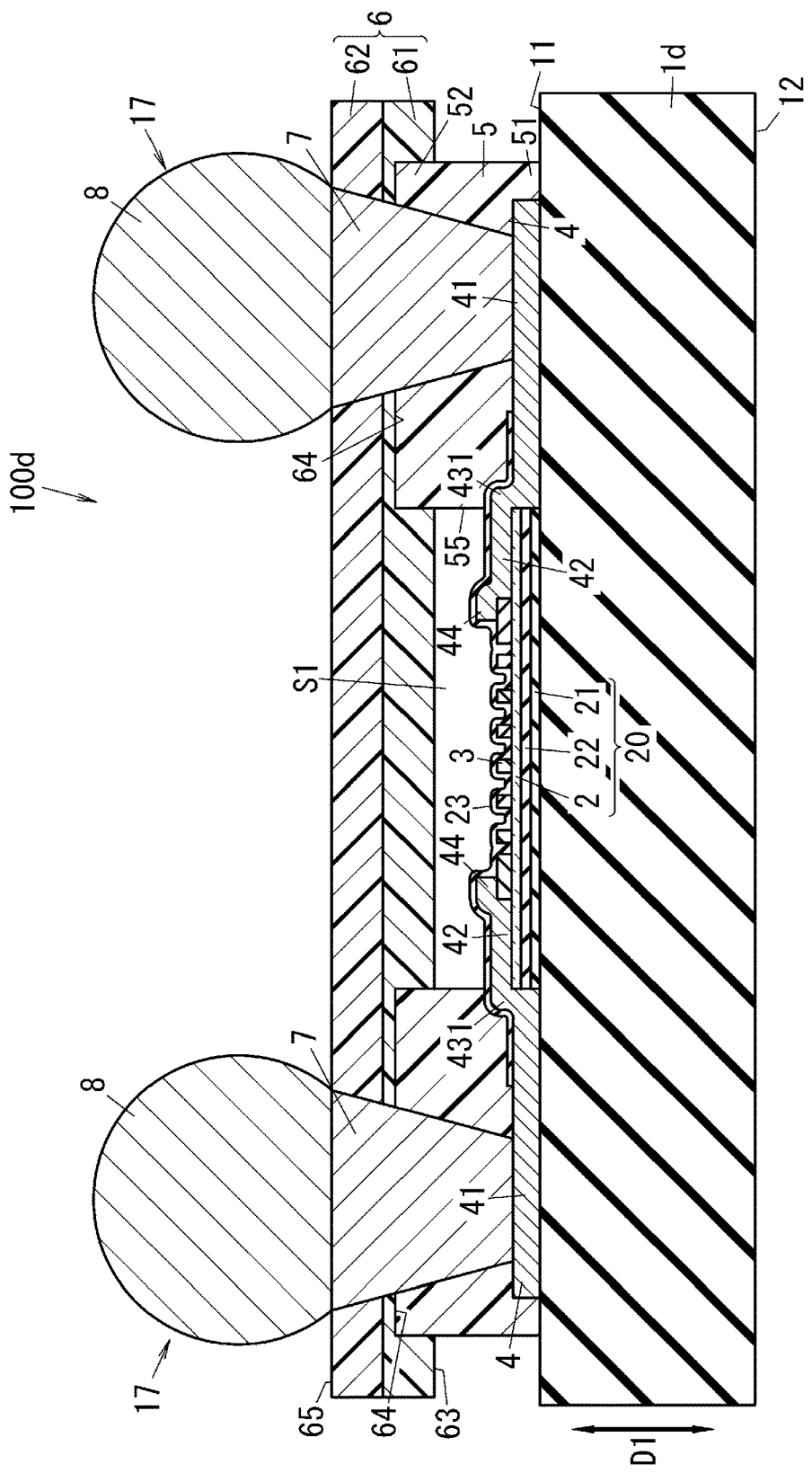
FIG. 7 is a cross-sectional view of an electronic component module according to a fifth preferred embodiment of the present invention.

An elastic wave device 100d according to a fifth preferred embodiment of the present invention is described below with reference to FIG. 7.

The elastic wave device 100d according to the fifth preferred embodiment differs from the elastic wave device 100 according to the first preferred embodiment in that it includes a support substrate 1d with electrical insulating properties in place of the support substrate 1 in the elastic wave device 100 according to the first preferred embodiment. The same reference numerals are used denote the same or similar elements in the elastic wave device 100d according to the fifth preferred embodiment as those in the elastic wave device 100 according to the first preferred embodiment, and are not described here.

The support substrate 1d defines a high acoustic velocity support substrate. The support substrate 1d may preferably be made of, for example, any of piezoelectric materials, including aluminum nitride, aluminum oxide, silicon nitride, sapphire, lithium tantalite, lithium niobite, and crystal, a variety of ceramic materials, including alumina, zirconia, cordierite, mullite, steatite, and forsterite, magnesia diamond, materials including any of the above-mentioned materials, and materials including any mixture of the above-mentioned materials.

The elastic wave device 100d according to the fifth preferred embodiment does not include the insulating layer 9 (see FIG. 1) in the elastic wave device 100 according to the first preferred embodiment. Accordingly, in the elastic wave device 100d according to the fifth preferred embodiment, the first section 41 in the wiring electrode 4 is disposed on the support substrate 1d. The step portion 431 in the wiring electrode 4 is disposed along the thickness direction D1 of the support substrate 1a and is in contact with the side surface of the piezoelectric film 2.

In the elastic wave device 100d according to the fifth preferred embodiment, the end portion 52, which is near the cover layer 6 in the spacer layer 5, is embedded in the cover layer 6, as in the case of the elastic wave device 100 according to the first preferred embodiment. Thus, the reliability of the wiring electrode 4 and ability to withstand the thermal shock test in the elastic wave device 100d according to the fifth preferred embodiment is able to be improved. In the elastic wave device 100d according to the fifth preferred embodiment, the cover layer 6 includes the recessed portion 64 in the first principal surface 63 in the region overlapping the spacer layer 5 as seen in the plan view from the thickness direction D1, as in the case of the elastic wave device 100 according to the first preferred embodiment. The end portion 52, which is near the cover layer 6 in the spacer layer 5, is embedded in the recessed portion 64. Accordingly, the reliability of the wiring electrode 4 and ability to withstand the thermal shock test in the elastic wave device 100d according to the fifth preferred embodiment is able to be improved.

The above-described first to fifth preferred embodiments are merely preferred embodiments included in various preferred embodiments of the present invention. As long as the advantageous effects of the present invention are achieved, various changes may be made to the above-described first to fifth preferred embodiments, depending on the design or other factors.

For example, the elastic wave devices 100, 100a, 100b, 100c, and 100d include one IDT electrode 3 disposed on the piezoelectric film 2. However, the number of IDT electrodes 3 may be more than one. If the elastic wave devices 100, 100a, 100b, 100c, and 100d include a plurality of IDT electrodes 3, for example, a band-pass filter in which a plurality of surface acoustic wave resonators including the IDT electrodes 3 are electrically connected together may be provided. In the elastic wave devices 100, 100a, 100b, 100c, and 100d, the elastic wave resonator including the IDT electrode 3 and piezoelectric film 2 may preferably be, for example, a one-port elastic wave resonator including a reflector (e.g., short-circuit grating) on both sides of the IDT electrode 3 in the direction in which elastic waves travel. The elastic wave resonator is not limited to the one-port elastic wave resonator, and one example thereof may be a longitudinally coupled elastic wave resonator including a plurality of IDT electrodes.

The elastic wave resonator including the functional electrode in the elastic wave devices 100, 100a, 100b, 100c, and 100d is preferably a SAW resonator, and the functional electrode is preferably the IDT electrode 3. The elastic wave resonator including the functional electrode is not limited to this configuration, and one example thereof may be a bulk acoustic wave (BAW) resonator. In this case, the BAW resonator includes a first electrode, a piezoelectric film, and a second electrode. The first electrode is disposed on the support substrate. The piezoelectric film is disposed on the first electrode. The second electrode is disposed on the piezoelectric film. In the BAW resonator, the second electrode defines the functional electrode.

In the elastic wave devices 100, 100a, 100b, 100c, and 100d, the cover layer 6 includes the first sublayer 61 and second sublayer 62, which are preferably made of different materials. The cover layer 6 may include only the first sublayer 61. In addition to the first sublayer 61 and second sublayer 62, another layer between the first sublayer 61 and second sublayer 62 may be included in the cover layer 6. That is, unlike the above-described preferred embodiments, in which the second sublayer 62 is disposed on the first sublayer 61, the second sublayer 62 may be disposed above the first sublayer 61 with an intervening layer therebetween.

An elastic wave device (100; 100a; 100b; 100c; 100d) according to a preferred embodiment of the present invention includes the support substrate (1; 1d), the piezoelectric film (2), the functional electrode (IDT electrode 3), the wiring electrodes (4), the spacer layer (5), the cover layer (6), and the through electrodes (7). The piezoelectric film 2 is disposed on or above the support substrate (1; 1d). The functional electrode (IDT electrode 3) is disposed on or above the piezoelectric film (2). The wiring electrodes (4) are electrically connected to the functional electrode (IDT electrode 3). The spacer layer (5) is disposed on or above the support substrate (1; 1d), and is disposed outside the piezoelectric film (2) as seen in a plan view from the thickness direction (D1) of the support substrate (1; 1d). The cover layer (6) is disposed on the spacer layer (5). The through electrodes (7) extend through the spacer layer (5) and cover layer (6) and are electrically connected to the wiring electrodes (4). Each of the wiring electrodes (4) includes the first section (41) overlapping the through electrode (7) as seen in the plan view from the thickness direction (D1), the second section (42) overlapping the piezoelectric film (2) as seen in the plan view from the thickness direction (D1), and the step portion (431) forming the step in the thickness direction (D1) between the first section (41) and second section (42). The end portion (52), which is near the cover layer (6) in the spacer layer (5), is embedded in the cover layer (6).

An elastic wave device (100; 100a; 100b; 100c; 100d) according to a preferred embodiment of the present invention improves the reliability of the wiring electrode (4) and ability to withstand the thermal shock test.

In an elastic wave device (100; 100a; 100b; 100c; 100d) according to a preferred embodiment of the present invention, the cover layer (6) includes the first sublayer (61) and the second sublayer (62). The second sublayer (62) is disposed on or above the first sublayer (61). The first sublayer (61) is nearer the support substrate (1; 1d) than the second sublayer (62). The Young's modulus of the first sublayer (61) is larger than that of the second sublayer (62).

In an elastic wave device (100; 100a; 100b; 100c; 100d) according to a preferred embodiment of the present invention, the spacer layer (5) is more securely supported by the first sublayer (61) in the cover layer (6).

In an elastic wave device (100; 100a; 100b; 100c; 100d) according to a preferred embodiment of the present invention, the depth of the end portion (52) embedded in the cover layer (6), the end portion (52) being near the cover layer (6) in the spacer layer (5), is not larger than the thickness of the first sublayer (61).

In an elastic wave device (100; 100a; 100b; 100c; 100d) according to a preferred embodiment of the present invention, the spacer layer (5) is more securely supported by the cover layer (6) than that in the case in which the depth of the end portion (52) embedded in the cover layer (6), the end portion (52) being near the cover layer (6) in the spacer layer (5), is larger than the thickness of the first sublayer (61).

In an elastic wave device (100; 100a; 100b; 100c; 100d) according to a preferred embodiment of the present invention, the material of the first sublayer (61) is an epoxy-based resin, and the material of the second sublayer (62) is a polyimide-based resin.

In an elastic wave device (100; 100a; 100b; 100c; 100d) according to a preferred embodiment of the present invention, the spacer layer (5) at least partially covers the step portion (431) as seen in the plan view from the thickness direction (D1).

In an elastic wave device (100; 100a; 100b; 100c; 100d) according to a preferred embodiment of the present invention, the reliability of the wiring electrode 4 and ability to withstand the thermal shock test is able to be further improved, in comparison with that in the case in which the spacer layer (5) does not at least partially cover the step portion (431) of the wiring electrode (4).

In an elastic wave device (100c) according to a preferred embodiment of the present invention, the wiring electrode (4) includes the first step portion (431) defining the step portion (431) and the second step portion (432). In the first step portion (431), the distance from the support substrate (1) in the thickness direction (D1) gradually increases along the direction from the first section (41) toward the second section (42). In the second step portion (432), the distance from the support substrate (1) in the thickness direction (D1) gradually decreases along the direction from the first section (41) toward the second section (42). The spacer layer (5) covers both of the first step portion (431) and second step portion (432) as seen in plan view from the thickness direction (D1).

In an elastic wave device (100c) according to a preferred embodiment of the present invention, concentration of the stress on each of the first step portion (431) and the second step portion (432) of the wiring electrode (4) is able to be reduced or prevented, and the reliability of the wiring electrode 4 and ability to withstand the thermal shock test is able to be further improved.

In an elastic wave device (100; 100a; 100b; 100c; 100d) according to a preferred embodiment of the present invention, the depth of the end portion (52) embedded in the cover layer (6), the end portion (52) being near the cover layer (6) in the spacer layer (5), is not smaller than about 2.0 μm.

In an elastic wave device (100; 100a; 100b; 100c) according to a preferred embodiment of the present invention, the insulating layer (9) disposed on the support substrate (1) is further included. The support substrate (1) is a silicon substrate. A portion of the wiring electrode (4) is disposed on the insulating layer (9). The spacer layer (5) is disposed on the wiring electrode (4) and insulating layer (9). The through electrode (7) is disposed on the wiring electrode (4).

In an elastic wave device (100; 100*a*; 100*b*; 100*c*) according to a preferred embodiment of the present invention, the wiring electrode (4) and the support substrate (1) are electrically insulated from each other by the insulating layer (9), and the reliability of the wiring electrode (4) and ability to withstand the thermal shock test is able to be further improved.

In an elastic wave device (100; 100*a*; 100*b*; 100*c*) according to a preferred embodiment of the present invention, the Young's modulus of the insulating layer (9) is smaller than that of the piezoelectric film (2).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a support substrate;
    a piezoelectric film disposed on or above the support substrate;
    a functional electrode disposed on or above the piezoelectric film;
    a wiring electrode electrically connected to the functional electrode;
    a spacer layer disposed on or above the support substrate, and disposed outside the piezoelectric film as seen in a plan view from a thickness direction of the support substrate;
    a cover layer disposed on the spacer layer; and
    a through electrode extending through the spacer layer and the cover layer and electrically connected to the wiring electrode; wherein
    the wiring electrode includes:
        a first section overlapping the through electrode as seen in the plan view from the thickness direction;
        a second section overlapping the piezoelectric film as seen in the plan view from the thickness direction;
        a first step portion defining a step in the thickness direction between the first section and the second section; and
        a second step portion;
    in the first step portion, a distance from the support substrate in the thickness direction gradually increases along a direction from the first section toward the second section;
    in the second step portion, the distance from the support substrate in the thickness direction decreases along the direction from the first section toward the second section;
    the spacer layer covers both of the first step portion and the second step portion as seen in the plan view from the thickness direction; and
    the spacer layer includes an end portion embedded in the cover layer.

2. The elastic wave device according to claim 1, wherein the cover layer includes:
    a first sublayer; and
    a second sublayer disposed on or above the first sublayer; wherein
    the first sublayer is closer to the support substrate than the second sublayer; and
    a Young's modulus of the first sublayer is larger than a Young's modulus of the second sublayer.

3. The elastic wave device according to claim 2, wherein a depth of the end portion embedded in the cover layer is not larger than a thickness of the first sublayer.

4. The elastic wave device according to claim 2, wherein the first sublayer is made of an epoxy-based resin; and the second sublayer is made of a polyimide-based resin.

5. The elastic wave device according to claim 1, wherein a depth of the end portion embedded in the cover layer is not smaller than about 2.0 µm.

6. The elastic wave device according to claim 1, further comprising:
    an insulating layer disposed on the support substrate; wherein
    the support substrate is a silicon substrate;
    a portion of the wiring electrode is disposed on the insulating layer;
    the spacer layer is disposed on the wiring electrode and the insulating layer; and
    the through electrode is disposed on the wiring electrode.

7. The elastic wave device according to claim 6, wherein a Young's modulus of the insulating layer is smaller than a Young's modulus of the piezoelectric film.

8. The elastic wave device according to claim 1, wherein the functional electrode is an interdigital transducer electrode.

9. The elastic wave device according to claim 8, wherein the interdigital transducer electrode is made of at least one of aluminum, copper, platinum, gold, silver, titanium, nickel, chromium, molybdenum, and tungsten, or an alloy including any of aluminum, copper, platinum, gold, silver, titanium, nickel, chromium, molybdenum, and tungsten.

10. The elastic wave device according to claim 1, further comprising an external connection terminal electrically connected to the through electrode.

11. The elastic wave device according to claim 1, wherein the piezoelectric film is made of lithium tantalite, lithium niobate, zinc oxide, aluminum nitride, or PZT.

12. The elastic wave device according to claim 1, wherein a high acoustic velocity film and a low acoustic velocity film are disposed between the piezoelectric film and the support substrate.

13. The elastic wave device according to claim 12, wherein
    the high acoustic velocity film is disposed on the support substrate;
    the low acoustic velocity film is disposed on the high acoustic velocity film; and
    the piezoelectric film is disposed on the low acoustic velocity film.

14. The elastic wave device according to claim 12, wherein the high acoustic velocity film is made of at least one of diamond-like carbon, aluminum nitride, aluminum oxide, silicon carbide, silicon nitride, silicon, sapphire, lithium tantalite, lithium niobite, crystal, alumina, zirconia, cordierite, mullite, steatite, forsterite, and magnesia diamond.

15. The elastic wave device according to claim 12, wherein the low acoustic velocity film is made of a compound in which fluorine, carbon, or boron is added to silicon oxide, glass, silicon oxynitride, tantalum oxide, or silicon oxide.

16. The elastic wave device according to claim 1, further comprising a protective film covering the functional electrode.

17. The elastic wave device according to claim 16, wherein the protective film is made of silicon oxide.

\* \* \* \* \*